United States Patent [19]
Yamada

[11] Patent Number: 5,553,090
[45] Date of Patent: Sep. 3, 1996

[54] SEMICONDUCTOR MULTIQUANTUM WELL STRUCTURE AND SEMICONDUCTOR LASER THEREWITH

[75] Inventor: Hirohito Yamada, Tokyo, Japan

[73] Assignee: NEC Corporation, Tokyo, Japan

[21] Appl. No.: 208,683

[22] Filed: Mar. 11, 1994

[30] Foreign Application Priority Data

Mar. 11, 1993 [JP] Japan ................................. 5-050278

[51] Int. Cl.$^6$ ...................................................... H01S 3/18
[52] U.S. Cl. ............................................... 372/45; 257/17
[58] Field of Search ................................ 372/45, 44, 43; 257/17

[56] References Cited

U.S. PATENT DOCUMENTS

| | | | |
|---|---|---|---|
| 4,599,728 | 7/1986 | Alavi et al. | 372/45 |
| 4,961,197 | 10/1990 | Tanaka et al. | 372/45 |
| 5,177,758 | 1/1993 | Oka et al. | 372/45 |
| 5,210,428 | 5/1993 | Goossen | 257/17 |
| 5,253,264 | 10/1993 | Suzuki et al. | 372/45 |
| 5,348,912 | 9/1994 | Choquette et al. | 372/45 |
| 5,392,306 | 2/1995 | Usami et al. | 372/45 |

OTHER PUBLICATIONS

"Ultralow Chirp and High–Speed 1.55 μm Multiquantum Well λ/4–Shifted DFB Lasers", *IEEE Photonics Technology Letters*, vol. 2, No. 4, Apr. 1990, pp. 229–230, by K. UOMI et al.

Papers of the 1989 IEICE Spring Conference, pp. 4–172 *Semiconductor Laser Conference*. (No Month).

Primary Examiner—Rodney B. Bovernick
Assistant Examiner—Robert McNutt
Attorney, Agent, or Firm—Young & Thompson

[57] ABSTRACT

A semiconductor multiquantum well structure is provided, which includes semiconductor well layers for forming quantum wells and semiconductor barrier layers for forming potential barriers each of which is arranged between adjacent two of the well layers. Each barrier layer is 7 nm or less in thickness. A number of the well layers is selected dependent upon the thickness of each barrier layer so that carriers or electrons and holes are injected into the respective quantum wells substantially uniformly. The number of the well layers is preferably 5 or more, and in the case, each barrier layer preferably ranges from 5 nm to 7 nm in thickness. A semiconductor laser having superior distortion characteristics at a high-frequency band such as 1 GHz can be provided.

13 Claims, 7 Drawing Sheets

SEMICONDUCTOR MULTIQUANTUM WELL STRUCTURE AND SEMICONDUCTOR LASER THEREWITH

BACKGROUND OF THE INVENTION

1. Field of the Invention

The present invention relates to a semiconductor Multi-Quantum Well (MQW) structure and a semiconductor laser whose active layer has the MQW structure.

2. Description of the Prior Art

Conventionally, Distributed Feedback (DFB) type semiconductor lasers with the MQW structure used for analog optical transmission are required to be superior in modulation distortion characteristic. For example, in the case of 42-channel subcarrier multiple transmission of Cable Tele-Vision (CATV), the composite second order (CSO) distortion of the laser has to be −60 dBc or less and the composite triple beat (CTB) distortion thereof has to be −65 Dbc or less, which are very severe specifications.

If the semiconductor MQW laser is employed for High Definition TeleVision (HDTV) whose working frequency band may be a 1 GHz band in the near future, it will be required to be smaller in modulation distortion than the case of CATV because of its higher modulation frequency.

From this point of view, conventional semiconductor lasers designed for analog optical transmission, including the MQW-DFB laser, are not sufficient in distortion characteristic for HDTV application.

Additionally, which the trunk line system of ultra-high-speed digital optical transmission in the near future, a transmission speed of about 10 Gb/s will be required. However, no semiconductor lasers applicable for such application has been realized.

SUMMARY OF THE INVENTION

Accordingly, an object of the present invention is to provide a semiconductor multiquantum well structure in which carriers are uniformly injected into respective quantum wells.

Another object of the present invention is to provide a semiconductor multiquantum well laser which is superior in distortion characteristics at a high-frequency band such as 1 Ghz, so that it can be used for analog optical transmission applications such as HDTV.

Still another object of the present invention is to provide a semiconductor multiquantum well laser which can be used for 10 Gb/s ultra-high-speed digital optical transmission.

According to the first aspect of the present invention, a semiconductor multiquantum well structure is provided, which includes semiconductor well layers for forming quantum wells and semiconductor barrier layers for forming potential barriers. Each of the barrier layers is arranged between adjacent two of the well layers and is 7 nm or less in thickness.

A thickness of each of the barrier layers is selected dependent upon a number of the well layers so that carriers are injected into the respective quantum wells substantially uniformly.

The number of the well layers is preferably 5 or more. In the case, each of the barrier layers ranges from 5 nm to 7 nm in thicknesses preferably.

When the number of the quantum well layers ranges from 5 to 7, that is, 5, 6 or 7, each of the barrier layers preferably ranges in thickness from 5 nm to 7 nm.

When the number of the quantum well layers ranges from 7 to 10, that is, 7, 8, 9 or 10, each of the barrier layers preferably ranges in thickness from 3 nm to 5 nm.

When the number of the quantum well layers is 10 or more, each of the barrier layers is preferably 3 nm or less in thickness.

Thus, the preferable thickness of each barrier layer changes with the number of the quantum well layers.

Any semiconductor materials are applicable for the MQW structure of the first aspect as the well layers and barrier layers. Preferably, InGaAs is used for the well layers and InGaAsP for the barrier layers.

With the semiconductor multiquantum well structure according to the first aspect of the present invention, carriers are uniformly injected into the quantum wells, so that a semiconductor laser having superior distortion characteristics at a high-frequency band such as 1 Ghz can be provided.

According to a second aspect of the present invention, a semiconductor multiquantum well laser is provided, which includes the semiconductor multiquantum well structure of the first aspect as an active layer.

With the semiconductor multiquantum well laser according to the second aspect, the laser has the semiconductor multiquantum well structure of the first aspect, so that it can be applied for analog optical transmission such as HDTV and for ultra-high-speed digital optical transmission such as 10 Gb/s.

DETAILED DESCRIPTION OF THE PREFERRED EMBODIMENTS

Preferred embodiments of the present invention will be described bellow while referring to the drawings attached.

First Embodiment

Figure 2:
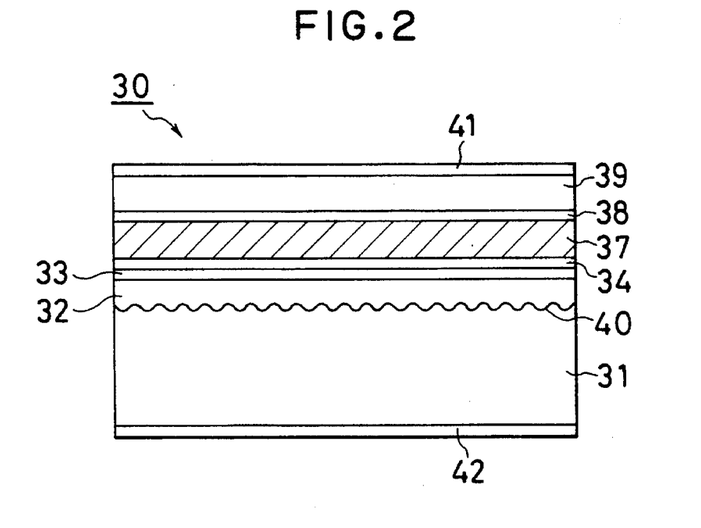
FIG. 2 is a cross-section of a semiconductor MQW laser according to a first embodiment of the present invention.

FIG. 2 shows a InGaAs/InGaAsP MQW laser according to a first embodiment, whose oscillation wavelength belongs to the 1.3 μm band.

In FIG. 2, the MQW laser 30 has an n-InP substrate 31 with a corrugation 40 on its surface. An n-InGaAsP optical guiding layer 32 with a thickness of 100 nm is formed on the surface of the substrate 31, and an n-InP spacer layer 33 with a thickness of 20 nm is formed on the optical guiding layer 32. The optical guiding layer 32 has a bandgap wavelength of 1.13 μm. An n-InGaAsP optical confinement layer 34 with a thickness of 30 nm is formed on the spacer layer 33. The confinement layer 34 has a bandgap wavelength of 1.13 μm.

Figure 3:
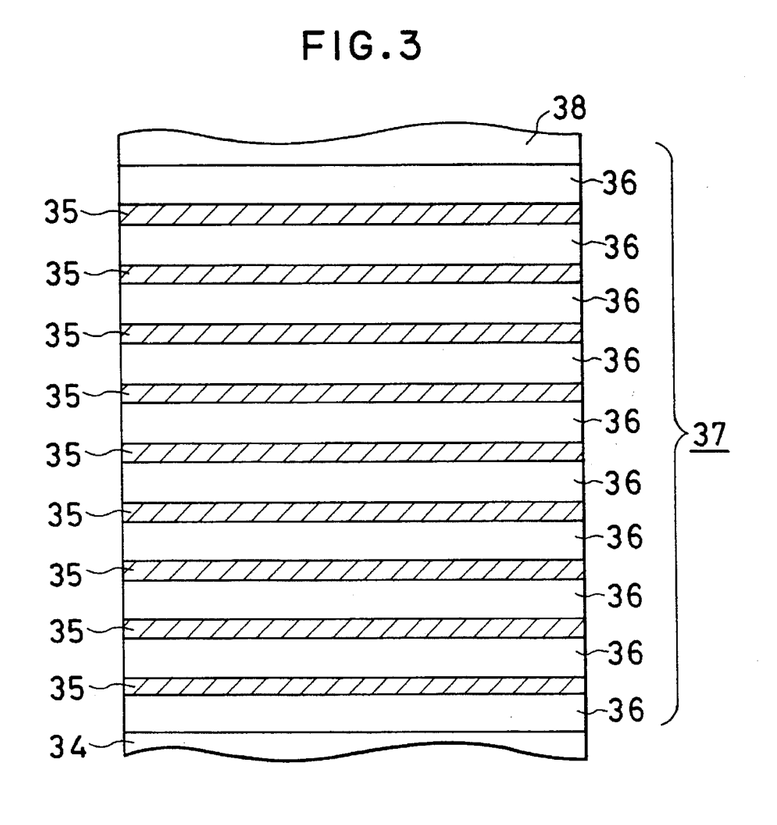
FIG. 3 is a cross-section of the MQW active layer of the laser shown in FIG. 2.

An active layer 37 of an MQW structure is formed on the confinement layer 34. As shown in FIG. 3, the active layer 37 has a layered structure composed of ten (10) n-InGaAsP well layers 36 and nine (9) n-InGaAsP barrier layers 35 each of which is arranged in the adjacent well layers 36. In other words, the barrier layers 35 and well layers 36 are alternately arranged in the direction perpendicular to the layers 35 and 36.

Each of the barrier layers 35 has a thickness of 3 nm and a bandgap wavelength of 1.13 μm. Each of the well layers 36 has a thickness of 5 nm and a bandgap wavelength of 1.40 μm.

A no impurity-doped InGaAsP optical confinement layer 38 with a thickness of 60 nm is formed on the active layer 37. The confinement layer 38 has a bandgap wavelength of 1.13 μm. A p-InP cladding layer 39 with a thickness of 0.6 μm is formed on the optical confinement layer 38.

The n-InGaAs well layer 36 disposed at one end of the active layer 37 is in contact with the n-InGaAsP optical confinement layer 34, and the well layer 36 disposed at the opposite end is in contact with the i-InGaAsP optical confinement layer 38.

A p-electrode 41 is formed on the optical confinement layer 39 and a n-electrode 42 is formed on the opposite or back surface of the substrate 31.

Since the optical confinement layers 34 and 38 are disposed at each side of the active layer 37, the laser 30 has the Separate Confinement Heterostructure (SCH).

Figure 5:
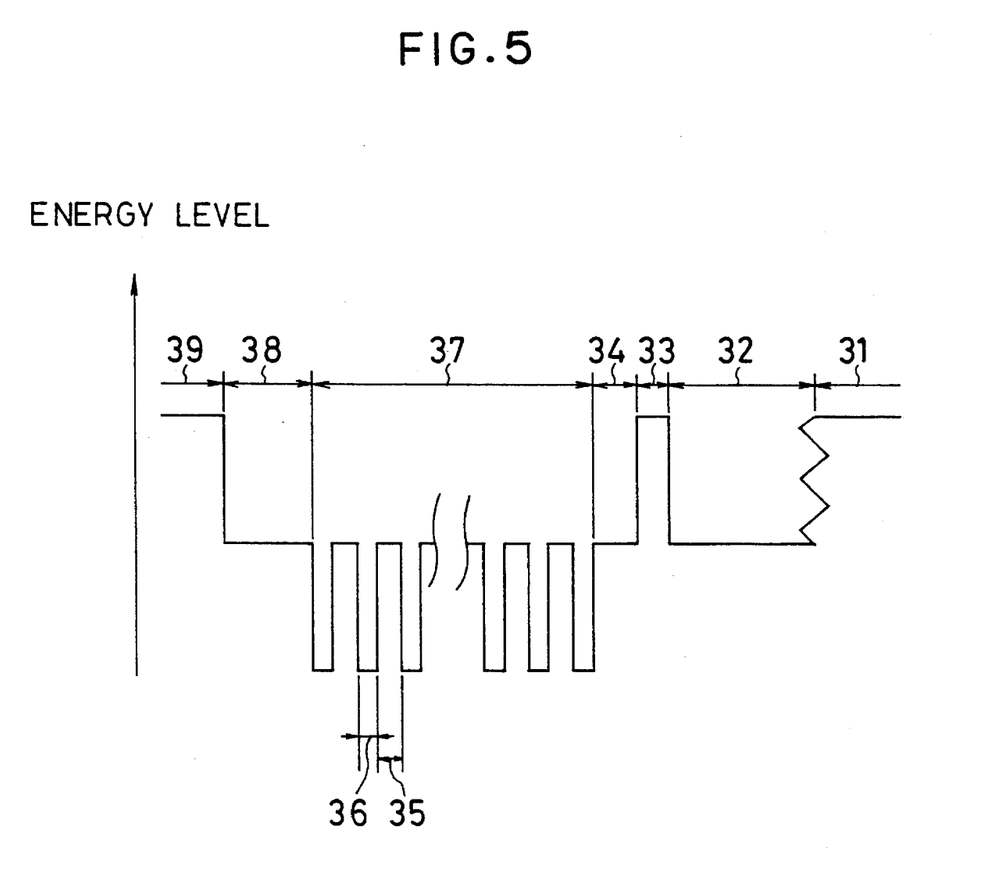
FIG. 5 is an energy band diagram of the MQW laser shown in FIG. 2.

An energy band diagram of the semiconductor MQW laser 30 as described above is shown in FIG. 5. It is seen from FIG. 5 that the optical guiding layer 32, the optical confinement layers 34 and 38 and the barrier layers 35 are the same in energy level with each other, and the well layers 36 are lower in energy level than these layers 34, 38 and 35. Thus, the respective well layers 36 act as traps for carriers, or electrons and holes.

The laser 30 may be fabricated using a Metal Organic Vapor Phase Epitaxy (MOVPE). In this case, first, the n-InGaAsP optical guiding layer 32 with a thickness of 100 nm is epitaxially grown on the surface of the n-InP substrate 31 with the corrugation 40. Then, the n-InP spacer layer 33 with a thickness of 20 nm and the n-InGaAsP optical confinement layer 34 with a thickness of 30 nm are epitaxially grown on the optical guiding layer 32 successively.

Next, on the n-InGaAsP optical confinement layer 34, the n-InGaAsP barrier layer 35 and the n-InGaAs well layer 36 are epitaxially grown alternately to form the MQW active layer 37. The i-InGaAsP optical confinement layer 38 and the p-InP cladding layer 39 are epitaxially grown on the MQW active layer 37 successively.

Finally, a metal film is formed on the optical confinement layer 39 to form the p-electrode 41 and another metal film is formed on the opposite or back surface of the substrate 31 to form the n-electrode 42.

Thus, the semiconductor MQW-laser 30 as shown in FIGS. 2 and 3 is obtained.

Figure 1A:
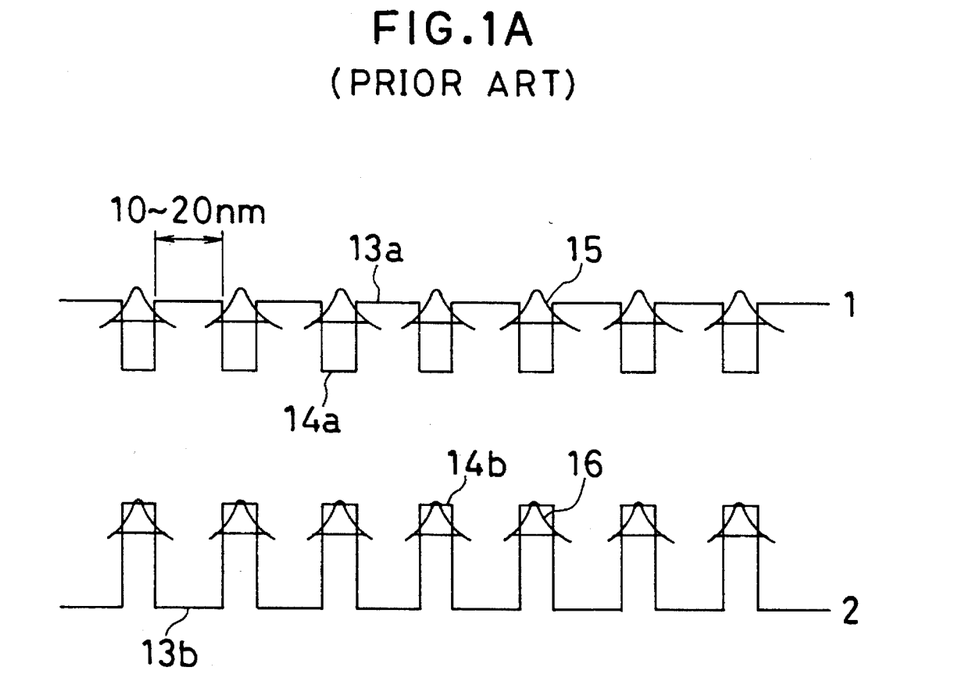
FIG. 1A schematically shows an energy band diagram of a conventional semiconductor MQW structure.
Figure 1B:
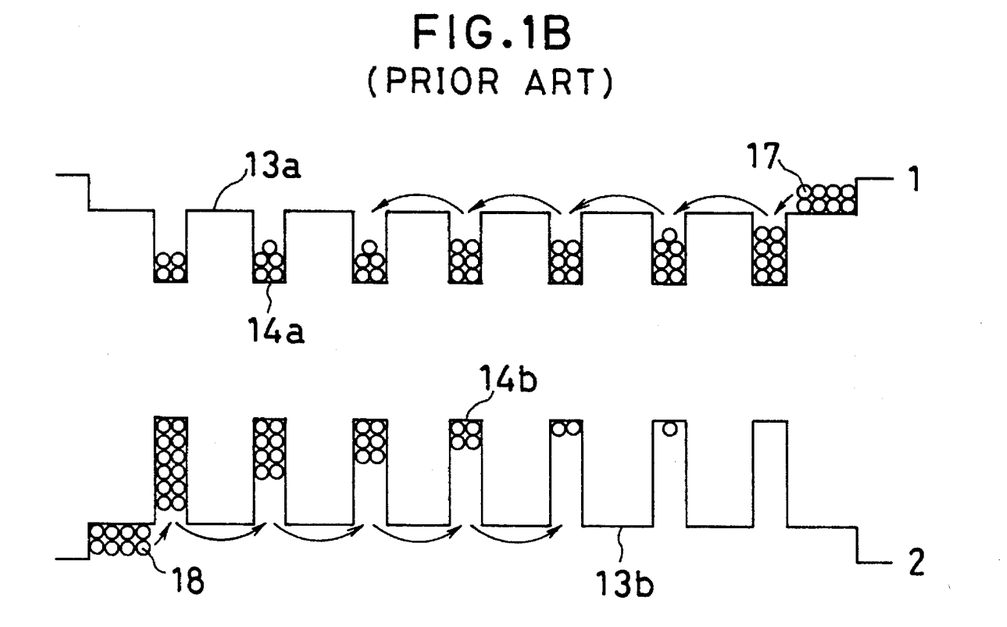
FIG. 1B schematically shows a state of carrier injection into the respective quantum wells of the conventional structure.
Figure 4A:
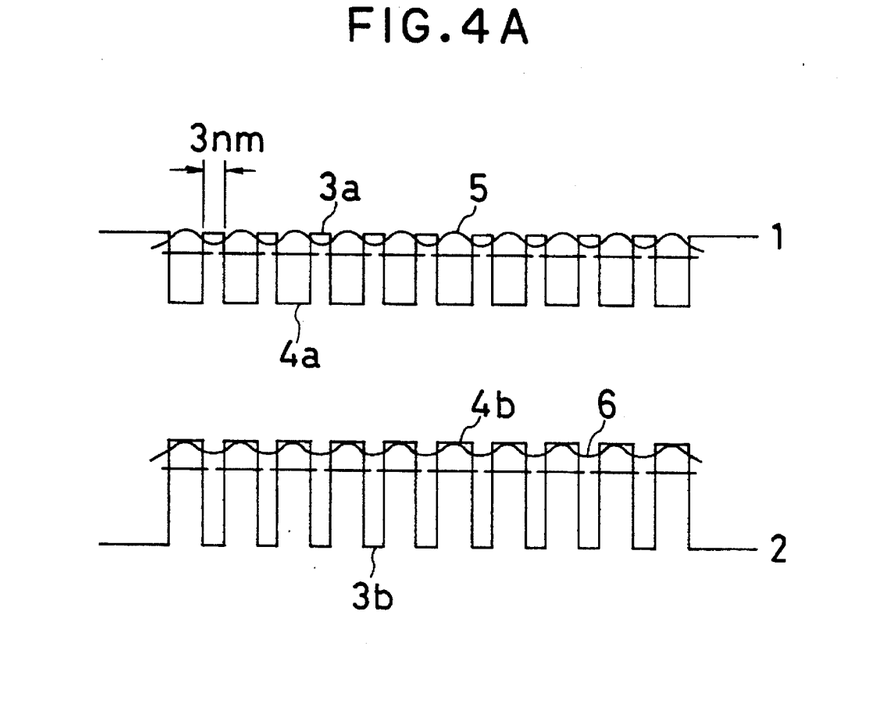
FIG. 4A schematically shows an energy band diagram of the MQW structure of the active layer shown in FIG. 3.
Figure 4B:
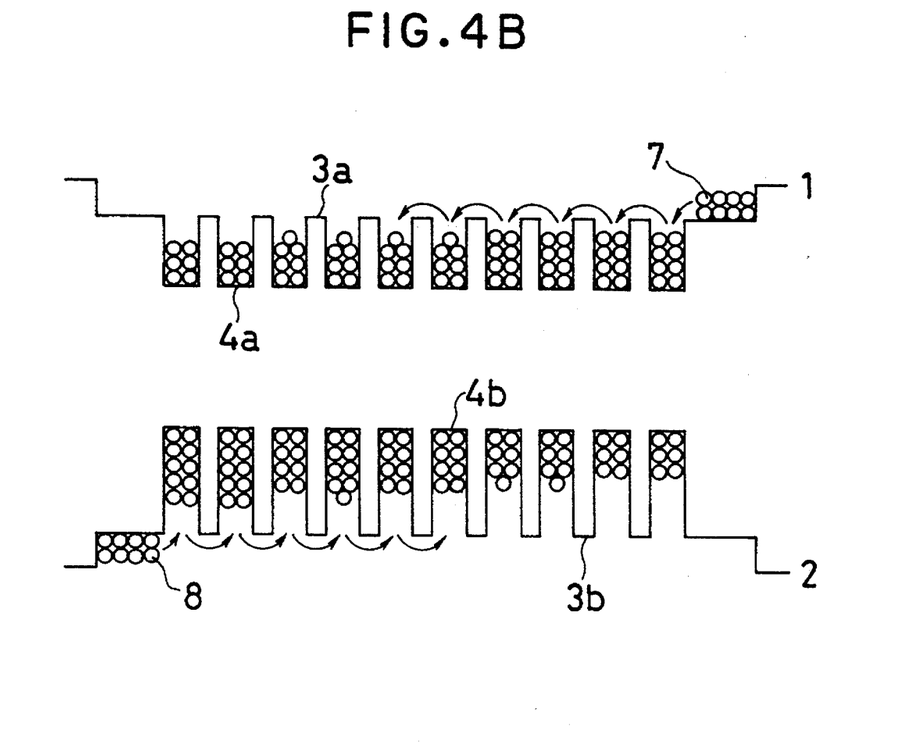
FIG. 4B schematically shows a state of carrier injection into the respective quantum wells of the MQW structure shown in FIG. 3.

FIGS. 4A and 4B schematically show an energy band diagram of the laser 30 and a state of carrier injection into the respective quantum wells of the MQW active layer 37, respectively. FIGS. 1A and 1B schematically show those of a conventional semiconductor MQW laser, respectively.

In the active layer 37 of the MQW layer 30, as shown in FIG. 4A, each barrier 3a in the conduction band 1 and each barrier 3b in the valence band 2 correspond to each of the barrier layers 36. Each quantum well 4a in the conduction band 1 and each quantum well 4b is the valence band 2 correspond to each of the well layers 36. Since each of the barriers 3a and 3b is 3 nm in thickness, both of the wavefunctions 5 of the adjacent quantum wells 4a in the conduction band 1 and the wavefunctions 6 of the adjacent quantum wells 4b in the valence band 2 are largely overlapped with each other, respectively. Therefore, it cannot be regarded that the respective wells 4a and 4b are independent of each other in both the conduction and valence bands 1 and 2.

Thus, under sufficient forward bias to the active layer 37, as shown in FIG. 4B, carriers or electrons 7 are substantially uniformly injected into the respective wells 4a in the conduction band 1. Similarly, in the valence band 2, carriers or holes 8 are substantially uniformly injected into the respective wells 4b. In the case, the differential gain of the laser 30 decreases slightly due to increase in transition energy; however, the relaxation oscillation frequency thereof becomes higher because of no saturation of the gain occurs. This means that high-speed response of the laser 30 can be realized and its analog modulation distortion characteristic can be improved.

In addition, to compensate the decrease in the differential gain, the numbers of the quantum wells 4a and 4b are set to be ten, respectively, so that a sufficiently differential gain can be provided.

On the other hand, in the conventional MQW active layer, as shown in FIG. 1A, each barrier 13a in the conduction band 1 and each barrier 13b in the valence band 2 usually ranges from 10 nm to 20 nm in thickness, respectively, which are very large. This means that adjacent quantum wells 14a in the conduction band 1 are apart or separated from each other and adjacent quantum wells 14b in the valence band 2 are the same with the wells 14a, so that there arise small overlaps between the wavefunctions 15 of the adjacent quantum wells 14a and between the wavefunctions 16 of the adjacent quantum wells 14b, respectively. As a result, it can be regarded that the respective wells 14a and 14b are independent of each other in both the conduction and valence bands 1 and 2.

With the conventional MQW active layer of the InGaAs/InGaAsP laser, under sufficient forward bias to the active layer, as shown in FIG. 1B, the carriers or electrons 17 are not uniformly injected into the respective wells 14a in the conduction band 1. Similarly, in the valence band 2, the carriers or holes 18 are not uniformly injected into the respective wells 14b. The holes 18 exhibit less uniformity in injection than the electrons 17 generally.

In this case, not only a sufficient differential gain, but also a high relaxation oscillation frequency cannot be obtained. Such low relaxation oscillation frequency is due to saturation of the gain at a high output.

As a result, no high-speed response of the conventional laser can be expected and the analog modulation distortion characteristics thereof is affected by the deteriorated relaxation oscillation. However, these problems can be solved by the present invention.

Next, the relationship between the effects of the invention and the thickness of the barrier layer 35 is explained below.

Figure 6:
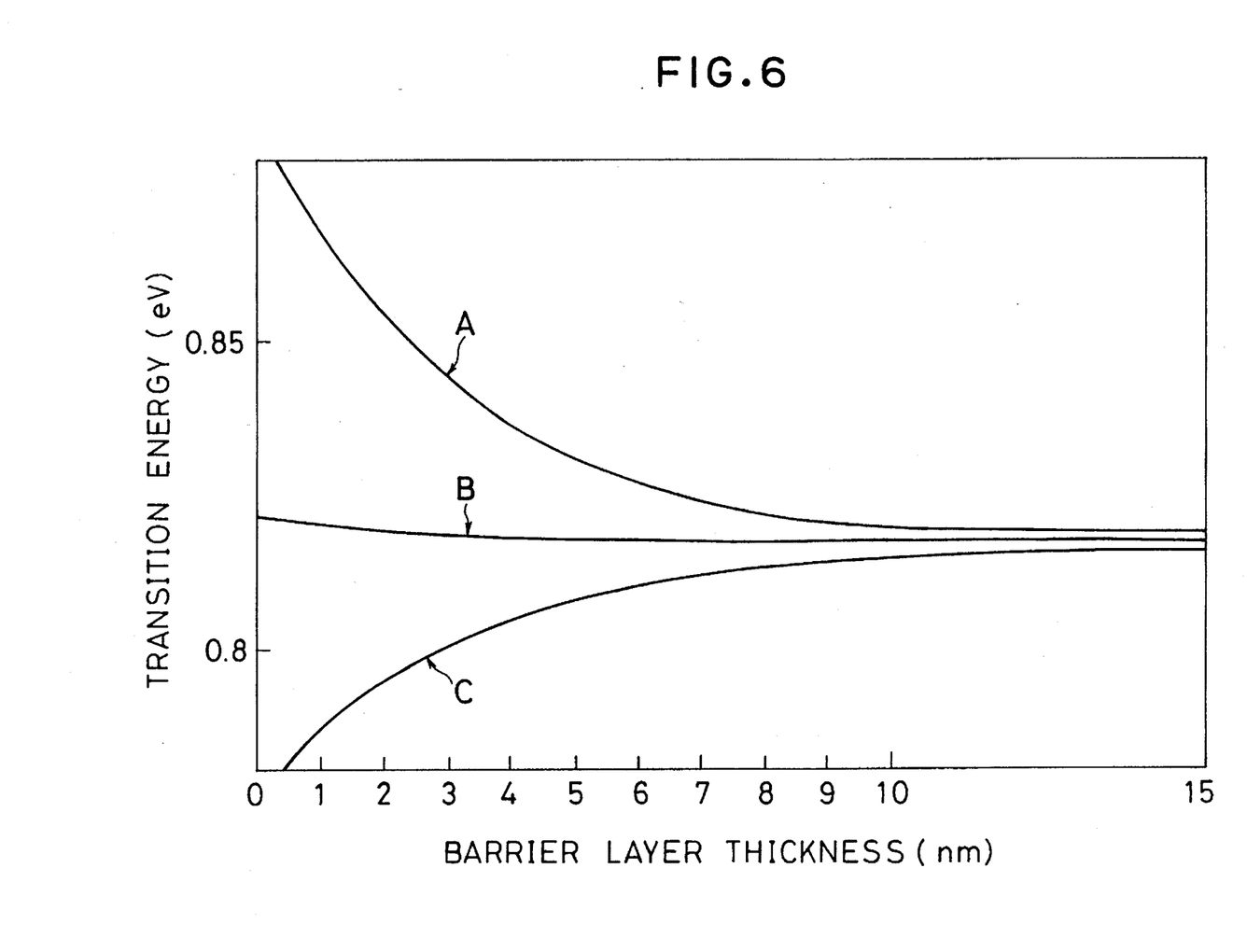
FIG. 6 is a graph showing relationships between the barrier layer thickness and transition energy of the laser shown in FIG. 2.

FIG. 6 shows calculated first three transition energy curves A, B and C for three coupled quantum wells of the first embodiment. As seen from FIG. 6, when the thickness of the barrier layer 35 is 10 nm or more, the transition energy separation between the curves A and C is about 5 meV or less. This means that the transition energy separation of the first quantum states is very small.

When the thickness of the barrier layer 35 is 7 nm or less, the transition energy separation between the curves A and C is about 10 mev or more. The transition energy separation is due to overlaps of the wavefunctions 5 and 6 between the adjacent quantum wells 4a and 4b for both the electrons 7 and holes 8.

It is seen from FIG. 6 that as the barriers 3a and 3b decrease in thickness, the adjacent wells 4a in the conduction band 1 and the adjacent wells 4b in the valence band 2 become more strongly coupled with each other, respectively. The value of 7 nm may be regarded as the threshold thickness from which the wells 4a and 4b start to be substantially coupled with each other.

Figure 7:
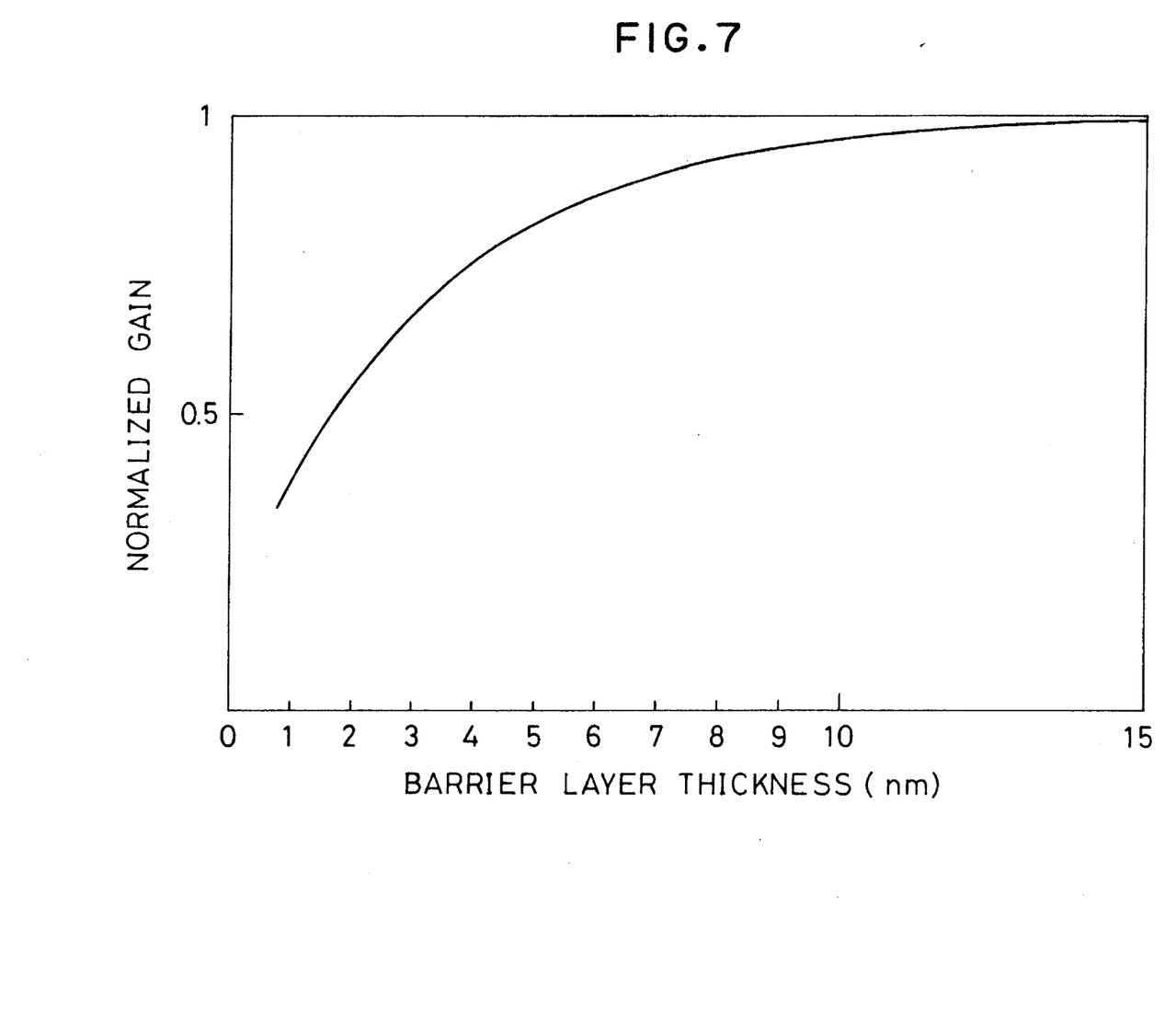
FIG. 7 is a graph showing a relationship between the barrier layer thickness and normalized optical gain of the laser shown in FIG. 2.

The energy separation between the quantum states increases as the decrease in barrier thickness and as a result, the differential gain decreases in general. However, as shown in FIG. 7, there arises only a gain reduction of about 10% or less when the barriers 3a and 3b are about 7 nm in thickness. In FIG. 7, the gain curve is expressed based on normalized values using the gain obtained in the case of an independent or single quantum well whose barrier is infinitely large in thickness.

In the case that the number of the wells is in the range from 5 to 7, which is comparatively small, nonuniform carrier injection is comparatively difficult to obtain. As a result, if the barriers 3a and 3b are as thick as about 7 nm, the nonuniform injection of the carriers, especially the holes, can be restrained without incurring a large gain reduction.

When the barriers 3a and 3b are about 5 nm in thickness, as seen from FIG. 6, the energy separation between the first quantum states increases to 20 meV or more. In other words, the couplings of the wells 4a and 4b become stronger, respectively. On the other hand, it is seen from FIG. 7 that the obtainable gain is about 80% of the gain of the independent quantum well case or more.

The thickness of about 5 nm is suitable for the number of the wells ranging from 7 to 10.

When the barriers 3a and 3b are reduced to be about 3 nm in thickness, as seen from FIG. 6, the energy separation between the first quantum states increases to be 40 meV or more, and the couplings of the wells 4a and 4b become to be much stronger, respectively. On the other hand, it is seen from FIG. 7 that the obtainable gain is reduced to be about 65% of the gain of the independent quantum well case.

The thickness of about 3 num is suitable for the number of the wells being 10 or more.

To confirm the effects or advantages of the laser 30, tests were carrier out at room temperature. In the tests, the laser 30 was fabricated as a Double Channel-Planer Buried Heterostructure (DC-PBH) laser and the p-electrode 41 was made as a mesa structure. The laser 30 was cut so that its resonator length was 300 µm and its one side facet was covered with an anti-reflection film and the opposite side facet with a high-reflection film of 70% reflectivity.

The result of the tests was as follows:

The average threshold current as 15 mA and the average slope efficiency was 0.4 W/A, which were almost the same as those of the conventional semiconductor MQW laser whose barrier layer was 10 nm in thickness.

Also, relaxation oscillation frequencies of the laser 30 and conventional laser were measured under a bias current twice as large as the threshold current. As a result, the frequency of the laser 30 was 8 GHz and that of the conventional one was 6 GHz. The value of 8 GHz is very high and is higher that the frequency of any conventional MQW laser.

Further, the distortion characteristics in the 1.5 GHz band were measured and as a result, the composite triple beat (CTB) distortion of the laser 30 was −80 dBc and that of the conventional one was −75 dBc, which means that the laser 30 was improved by 5 dB compared with the conventional laser.

As described above, the MQW laser 30 of the first embodiment is superior in distortion characteristics at a high-frequency band such as 1 GHz, so that it can be used for analog optical transmission such as the HDTV. Additionally, it can be used for ultra-high-speed digital optical transmission such as 10 Gb/s.

The number of the well layers 36 may be larger than 10 if the barrier layer 35 is 3 nm or less in thickness. The same advantage can be obtained.

Second Embodiment

Figure 8:
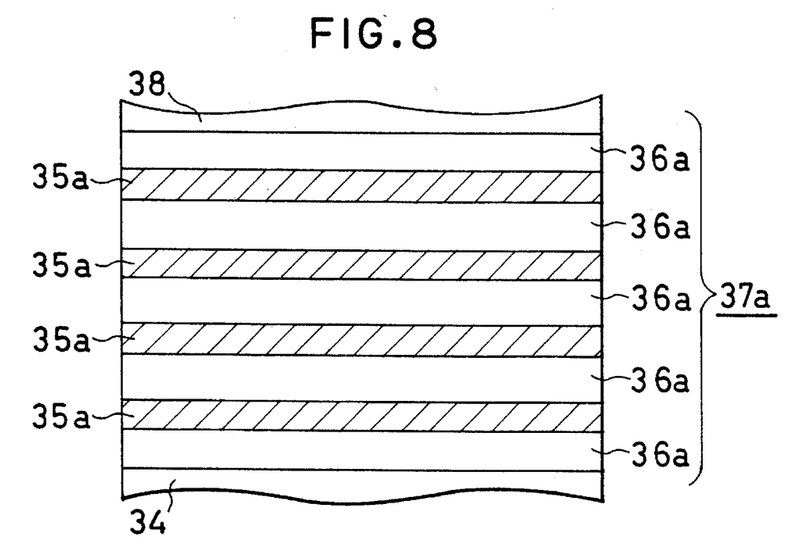
FIG. 8 is a cross-section of an MQW active layer of a semiconductor laser according to a second embodiment of the present invention.

FIG. 8 shows an InGaAs/InGaAsP active layer 37a of an MQW laser according to a second embodiment of the present invention, whose oscillation wavelength belongs to the 1.3 µm band.

Similar to the first embodiment, the MQW active layer 37a is formed on the optical confinement layer 34 and the i-InGaAsP optical confinement layer 38 is formed on the active layer 37a. The structure other than the active layer 37a is the same as that of the first embodiment.

The active layer 37a has a layered structure composed of five (5) n-InGaAsP well layers 36a and four (4) n-InGaAsP barrier layers 35a each of which is arranged in the adjacent well layers 36a. Each of the barrier layers 35a has a thickness of 7 nm and a bandgap wavelength of 1.13 µm. Each of the well layers 36a has a thickness of 5 nm and a bandgap wavelength of 1.40 µm.

The well layer 36a disposed at one end of the active layer 37a is in contact with the n-InGaAsP optical confinement layer 34, and the well layer 36a disposed at the opposite end thereof is in contact with the n-InGaAsP optical confinement layer 38.

In the second embodiment, the same effects as the first embodiment can be obtained.

The number of the well layers 36a may be 6 or 7 if each of the barrier layers 35a is in the range from 5 nm to 7 nm in thickness.

Third Embodiment

Figure 9:
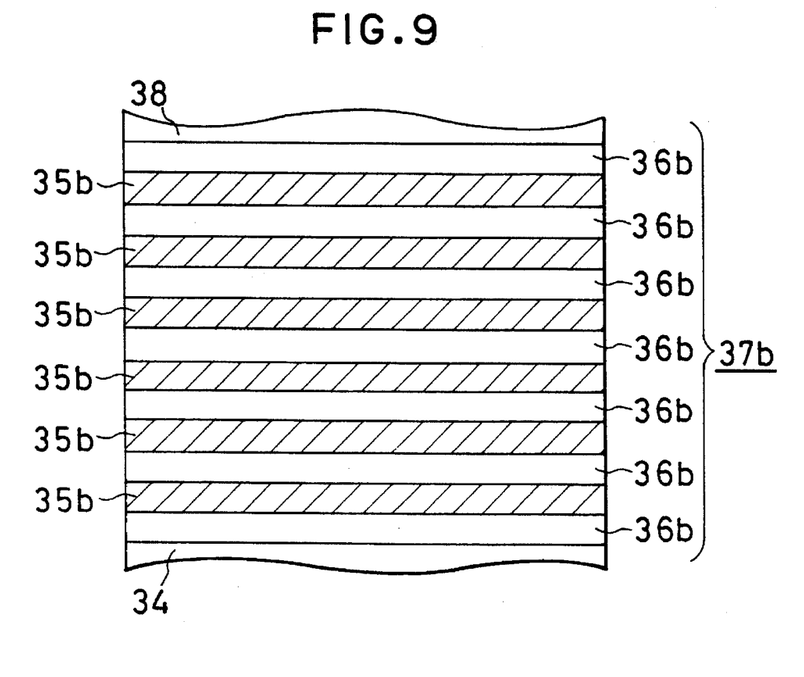
FIG. 9 is a cross-section of an MQW active layer of a semiconductor laser according to a third embodiment of the present invention.

FIG. 9 shows an InGaAs/InGaAsP active layers 37a of an MQW laser according to a third embodiment of the present invention, whose oscillation wavelength belongs to the 1.3 µm band.

Similar to the first embodiment, the MQW active layer 37b is formed on the n-InGaAsP optical confinement layer 34 and the i-InGaAsP optical confinement layer 38 is formed on the active layer 37b. The structure other than the active layer 37b is the same as that of the first embodiment.

The active layer 37b has a layered structure composed of seven (7) n-InGaAs well layers 36b and six (6) n-InGaAsP barrier layers 35b each of which is arranged in the adjacent well layers 36b. Each of the barrier layers 35b has a thickness of 5 nm and a bandgap wavelength of 1.13 μm. Each of the well layers 36b has a thickness of 5 nm and a bandgap wavelength of 1.40 μm.

The well layer 36b disposed at one end of the active layer 37b is in contact with the optical confinement layer 34, and the well layer 36d disposed at the opposite end thereof is in contact with the optical confinement layer 38.

Also in the third embodiment, the same effects as the first embodiment can be obtained.

The number of the well layers 36b may be 8, 9 or 10 if the barrier layer 35b is in the range from 3 nm to 5 nm in thickness.

The MQW structure of the present invention is applied for the semiconductor laser in the first to third embodiments; however, it may be applied for any types of semiconductor lasers such as a DFB laser. Additionally, the MQW structure can be applied for any other MQW lasers, for example, (a) an InGasAs/InGaAsP MQW laser whose oscillation wavelength belongs to the 1.5 μm band, (b) an MQW laser made of GaInAs, GaAlAs or the like.

Further, the MQW structure may be applied not only for any light receiving devices such as an Avalanche Photo-Diode (APD) but also for any channel structures of super-high-speed transistors used for satellite communications.

What is claimed is:

1. A semiconductor multiquantum well structure comprising:
   semiconductor well layers for forming quantum well;
   semiconductor barrier layers for forming potential barriers of said quantum wells;
   each of said barrier layers being arranged between adjacent two of said well layers;
   each of said barrier layers ranging from 5 nm to 7 nm in thickness; and
   a number of said well layers being selected between 5 and 7 so that carriers are injected into said respective quantum wells substantially uniformly;
   said barrier layers being made of InGaAsP and said well layers being made of InGaAs.

2. A semiconductor multiquantum well structure comprising:
   semiconductor well layers for forming quantum wells;
   semiconductor barrier layers for forming potential barriers of said quantum wells;
   each of said barrier layers being arranged between adjacent two of said well layers;
   each of said barrier layers ranging from 3 nm to 5 nm in thickness; and
   a number of said well layers being selected between 7 and 10 so that carriers are injected into said respective quantum wells substantially uniformly.

3. A multiquantum well structure as claimed in claim 2, wherein said barrier layers are made of InGaAsP and said well layers are made of InGaAs.

4. A semiconductor multiquantum well structure comprising:
   semiconductor well layers for forming quantum wells;
   semiconductor barrier layers for forming potential barriers of said quantum wells;
   each of said barrier layers being arranged between adjacent two of said well layers;
   each of said barrier layers being at most 3 nm in thickness; and
   a number of said well layers being selected to be at least 10 so that carriers are injected into said respective quantum wells substantially uniformly;
   said barrier layers being made of InGaAsP and said well layers being made of InGaAs.

5. A semiconductor multiquantum well laser comprising:
   a semiconductor substrate;
   a first semiconductor layer formed on said substrate;
   a multiquantum well active layer formed on said first semiconductor layer;
   a second semiconductor layer formed on said active layer;
   said active layer comprising:
     a number at least equal to five of semiconductor well layers for forming quantum wells;
     semiconductor barrier layers for forming potential barriers of said quantum wells;
     each of said barrier layers ranging from 5 nm to 7 nm in thickness and being arranged between adjacent two of said well layers; and
     said number of said well layers being selected dependent upon a thickness of each of said barrier layers so that carriers are injected into said respective quantum wells substantially uniformly;
     said barrier layers being made of InGaAsP and said well layers being made of InGaAs.

6. A multiquantum well laser as claimed in claim 5, wherein said first and second semiconductor layers are optical confinement layers made of InGaAsP.

7. A semiconductor multiquantum well laser comprising:
   a semiconductor substrate;
   a first semiconductor layer formed on said substrate;
   a multiquantum well active layer formed on said first semiconductor layer;
   a second semiconductor layer formed on said active layer;
   said active layer comprising:
     semiconductor well layers for forming quantum wells;
     semiconductor barrier layers for forming potential barriers of said quantum well;
     each of said barrier layers being arranged between adjacent two of said well layers;
     each of said barrier layers ranging from 5 nm to 7 nm in thickness; and
     a number of said well layers being selected between 5 and 7 so that carriers are injected into said respective quantum wells substantially uniformly;
     said barrier layers being made of InGaAsP and said well layers being made of InGaAs.

8. A multiquantum well laser as claimed in claim 7, wherein said first and second semiconductor layers are optical confinement layers made of InGaAsP.

9. A semiconductor multiquantum well structure comprising:
   a semiconductor substrate;
   a first semiconductor layer formed on said substrate;
   a multiquantum well active layer formed on said first semiconductor layer;
   a second semiconductor layer formed on said active layer;
   said active layer comprising:
     semiconductor well layers for forming quantum wells;
     semiconductor barrier layers for forming potential barriers of said quantum wells;

each of said barriers layers being arranged between adjacent two of said well layers;

each of said barrier layers ranging from 3 nm to 5 nm in thickness; and a number of said well layers being selected between 7 and 10 so that carriers are injected into said respective quantum wells substantially uniformly.

10. A multiquantum well laser as claimed in claim 9, wherein said barrier layers are made of InGaAsP and said well layers are made of InGaAs.

11. A multiquantum well laser as claimed in claim 10, wherein said first and second semiconductor layers are optical confinement layers made of InGaAsP.

12. A semiconductor multiquantum well structure comprising;

a semiconductor substrate;

a first semiconductor layer formed on said substrate;

a multiquantum well active layer formed on said first semiconductor layer;

a second semiconductor layer formed on said active layer;

said active layer comprising:

semiconductor well layers for forming quantum wells;

semiconductor barrier layers for forming potential barriers of said quantum wells;

each of said barrier layers being arranged between adjacent two of said well layers;

each of said barrier layers being at most 3 nm in thickness; and a number of said well layers being selected to be 10 or more so that carriers are injected into said respective quantum wells substantially uniformly;

said barrier layers being made of InGaAsP and said well layers being made of InGaAs.

13. A multiquantum well laser as claimed in claim 12, wherein said first and second semiconductor layers are optical confinement layers made of InGaAsP.

* * * * *